(12) United States Patent
Song (10) Patent No.: US 6,511,894 B2
(45) Date of Patent: Jan. 28, 2003

(54) MEMS RELAY AND METHOD OF FABRICATING THE SAME

(75) Inventor: Hoon Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/056,009

(22) Filed: Jan. 28, 2002

(65) Prior Publication Data

US 2002/0160583 A1 Oct. 31, 2002

(30) Foreign Application Priority Data

Apr. 26, 2001 (KR) ........................................ 2001-22676

(51) Int. Cl.[7] .............................................. H01L 21/30
(52) U.S. Cl. ....................................................... 438/455
(58) Field of Search .............................. 438/455, 456, 438/52, 691, 977; 257/415, 419

(56) References Cited

U.S. PATENT DOCUMENTS

| | | | | |
|---|---|---|---|---|
| 5,619,061 A | * | 4/1997 | Goldsmith et al. | ......... 257/528 |
| 6,297,072 B1 | * | 10/2001 | Tilmans et al. | ............ 438/106 |
| 6,356,689 B1 | * | 3/2002 | Greywall | .................... 385/52 |
| 6,410,360 B1 | * | 6/2002 | Steenberge | .................. 438/52 |

* cited by examiner

*Primary Examiner*—David Nelms
*Assistant Examiner*—Quoc Hoang
(74) *Attorney, Agent, or Firm*—Burns Doane Swecker & Mathis, LLP (57) ABSTRACT

A MEMS relay is provided. The MEMS relay includes a first wafer, a second wafer, and a third wafer that are sequentially stacked. The first wafer includes driving electrodes positioned at the bottom surface of the first wafer, input signal electrodes and output signal electrodes formed adjacent to each other and corresponding to the driving electrodes, via holes formed through the first wafer on the driving electrodes, the input signal electrodes, and the output signal electrodes, and metal pads formed over the via holes. The second wafer includes a body including a sealing unit used to hermetically seal the first and third wafers with the second wafer interposed therebetween, a driving unit which is formed inside and isolated from the body, is an integrated body consisting of a silicon substrate, a passivation layer formed on the silicon substrate, and contact electrodes formed on the passivation layer, and is located lower than the top surface of the body by a predetermined distance, and a connection supporter which extends from two opposing sides of the driving unit to the inner surface of the body. The third wafer includes a hollow in which the driving unit can be rotated.

9 Claims, 8 Drawing Sheets

MEMS RELAY AND METHOD OF FABRICATING THE SAME

BACKGROUND OF THE INVENTION

1. Field of the Invention

The present invention relates to a micro electromechanical system (MEMS) relay, and more particularly, to a MEMS relay in which two switches that are integrated in one structure are turned on/off opposite to each other in seesaw fashion.

2. Description of the Related Art

As techniques for manufacturing semiconductor integrated circuits have been developed, the size of active devices used in electronic products has been considerably reduced. However, the size of passive devices, such as a relay, a variable capacitor, and a variable inductor, has not been sufficiently reduced. Thus, the reduction of the size of passive devices has become an important problem awaiting solution.

Figure 1:
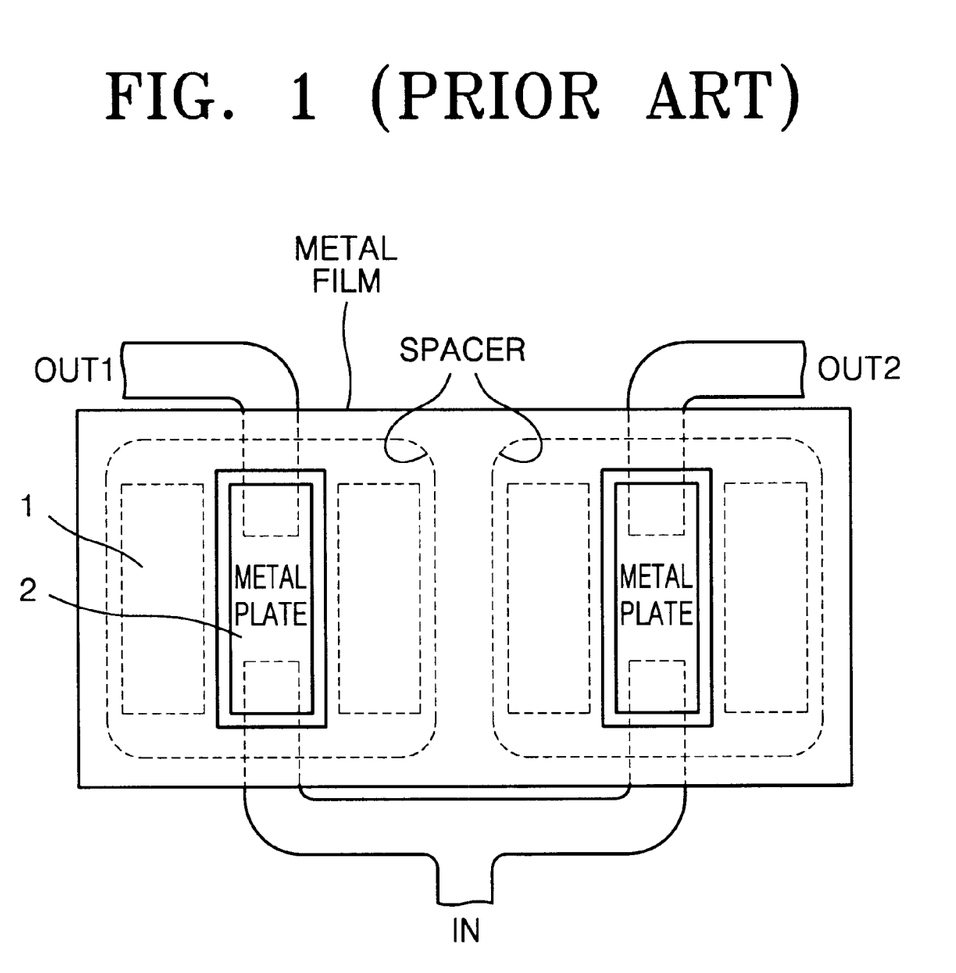
FIG. 1 is a schematic plan view of a conventional MEMS relay.

Most conventional MEMS relay switches comprise a single switch. In the case of a plurality of switches, each of the switches operates independently of the others, as disclosed in U.S. Pat. No. 5,619,061. FIG. 1 is a schematic plan view illustrating a conventional MEMS relay disclosed in the above U.S. patent. Referring to FIG. 1, if pull-down voltage is applied to a control electrode 1 of switches each having an input signal electrode IN and an output signal electrode OUT1 or OUT2, a metal plate 2 is bent down due to an electrostatic force acting between the control electrode 1 and the metal plate 2 such that the metal plate 2 partially contacts the input and output signal electrodes IN and OUT1 or OUT2. Two switches shown in FIG. 1 can operate independently by the control electrode 1.

However, the conventional MEMS relay has the following problems. When the metal plate 2 is isolated from the input and output signal electrodes IN, and OUT1 and OUT2, in other words, when the MEMS relay is turned off, the metal plate 2 may swing. In addition, it is necessary to increase the area of the MEMS relay in order to perform wire-bonding on the MEMS relay during packaging, and accordingly, the packaging area where the MEMS relay switch is packaged is also increased.

SUMMARY OF THE INVENTION

To solve the above-described problems, it is a first object of the present invention to provide a MEMS relay that is structurally stable and is compact, in which two switches are integrated into one structure but operate opposite to each other.

It is a second object of the present invention to provide a method of fabricating the MEMS relay.

Accordingly, to achieve the first object, there is provided a MEMS relay which comprises a first wafer, a second wafer, and a third wafer that are sequentially stacked. The first wafer includes driving electrodes positioned at the bottom surface of the first wafer, input signal electrodes and output signal electrodes formed adjacent to each other and corresponding to the driving electrode, via holes formed through the first wafer on the driving electrodes, the input signal electrodes, and the output signal electrodes, and metal pads formed over the via holes. The second wafer includes a body including a sealing unit used to hermetically seal the first and third wafers with the second wafer interposed therebetween, a driving unit which is formed inside and isolated from the body, is an integrated body consisting of a silicon substrate, a passivation layer formed on the silicon substrate, and contact electrodes formed on the passivation layer, and is located lower than the top surface of the body by a predetermined distance, and a connection supporter which extends from two opposing sides of the driving unit to the corresponding inner surface of the body. The third wafer includes a hollow in which the driving unit can be rotated.

Preferably, the connection supporter includes a torsion spring, which extends from the two opposing sides of the driving unit outwardly, and an anchor which connects the torsion spring to the corresponding inner surface of the body.

Preferably, an electrode supporter is further formed on the third wafer to support each of the input and output signal electrodes.

Preferably, the second wafer is formed of silicon, and the first and third wafers are formed of Pyrex glass.

Preferably, the passivation layer is a $SiO_2$ layer or a $Si_3N_4$ layer.

Preferably, ball grid arrays (BGAS) are further formed on the metal pads.

To achieve the second object, there is provided a method of fabricating a MEMS relay including (a) preparing a silicon wafer as a second wafer and two Pyrex glass wafers as first and third wafers, (b) forming a mask on the second wafer and anisotropically etching the second wafer using the mask, (c) forming a passivation layer in the middle of the second wafer and forming contact electrodes on the passivation layer by patterning, (d) forming electrodes at the bottom of the first wafer by patterning, (e) bonding the first and second wafers to each other, (f) planarizing the upper portion of the first wafer by chemical mechanical polishing (CMP), forming via holes through the first wafer, and forming metal pads over the via holes, (g) planarizing the lower portion of the second wafer by CMP, and patterning and etching the bottom portion of the second wafer, (h) forming a hollow in the third wafer by etching a predetermined portion of the third wafer, and (i) bonding the third wafer to the lower portion of the second wafer.

Preferably, the method further includes forming BGAs on the metal pads after the step (f). Preferably, in the step (i), the third wafer and the second wafer are anodically bonded to each other.

BRIEF DESCRIPTION OF THE DRAWINGS

The above objects and advantages of the present invention will become more apparent by describing in detail a preferred embodiment thereof with reference to the attached drawings in which:

FIG. 7 is a cross-sectional view illustrating a MEMS relay according to a preferred embodiment of the present invention in a state in which a left switch is turned on.

DETAILED DESCRIPTION OF THE INVENTION

The present invention will now be described more fully with reference to the accompanying drawings in which a preferred embodiment of the invention is shown.

Figure 2:
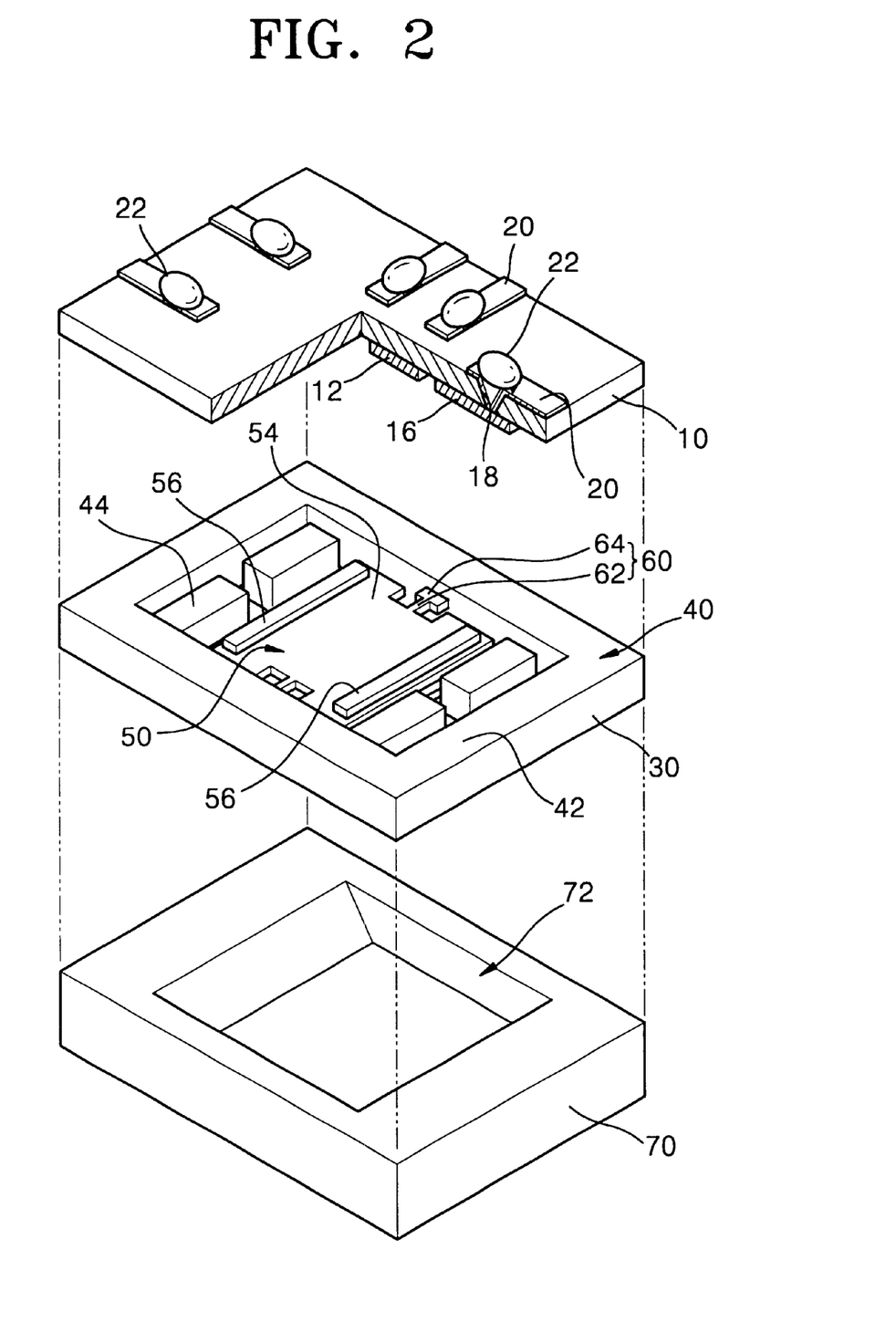
FIG. 2 is an exploded perspective view of a MEMS relay according to the present invention.
Figure 3:
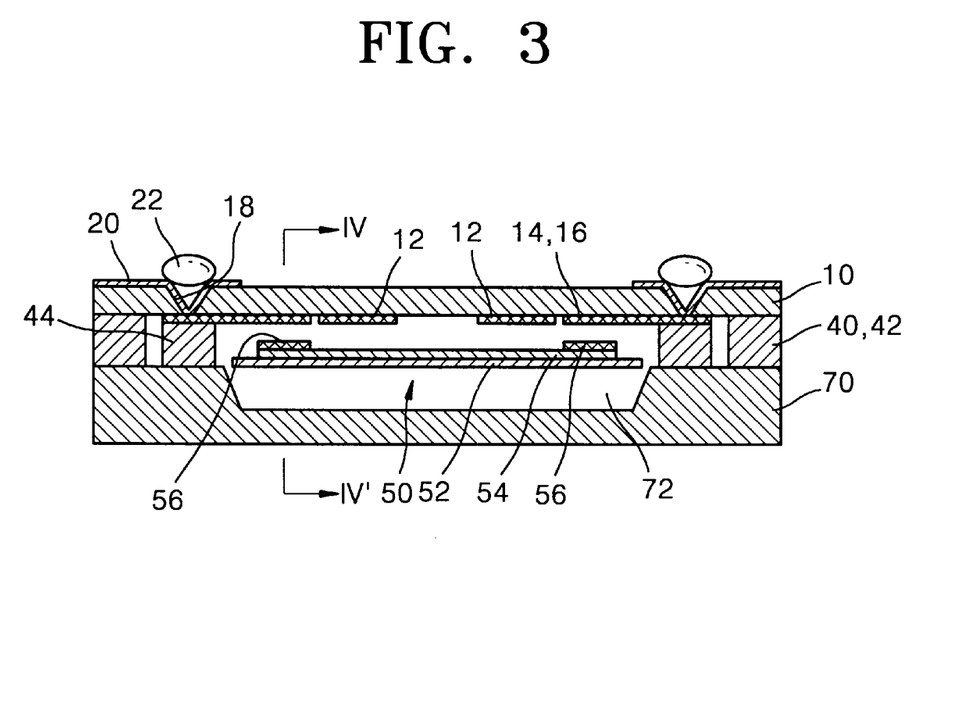
FIG. 3 is a cross-sectional view of a MEMS relay according to a preferred embodiment of the present invention.
Figure 4:
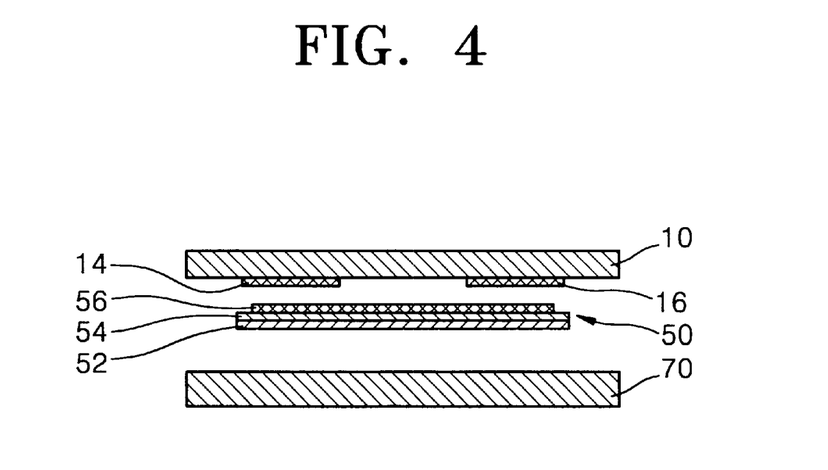
FIG. 4 is a cross-sectional view of a MEMS relay according to a preferred embodiment of the present invention, taken along line IV–IV' of FIG. 3.
Figure 5:
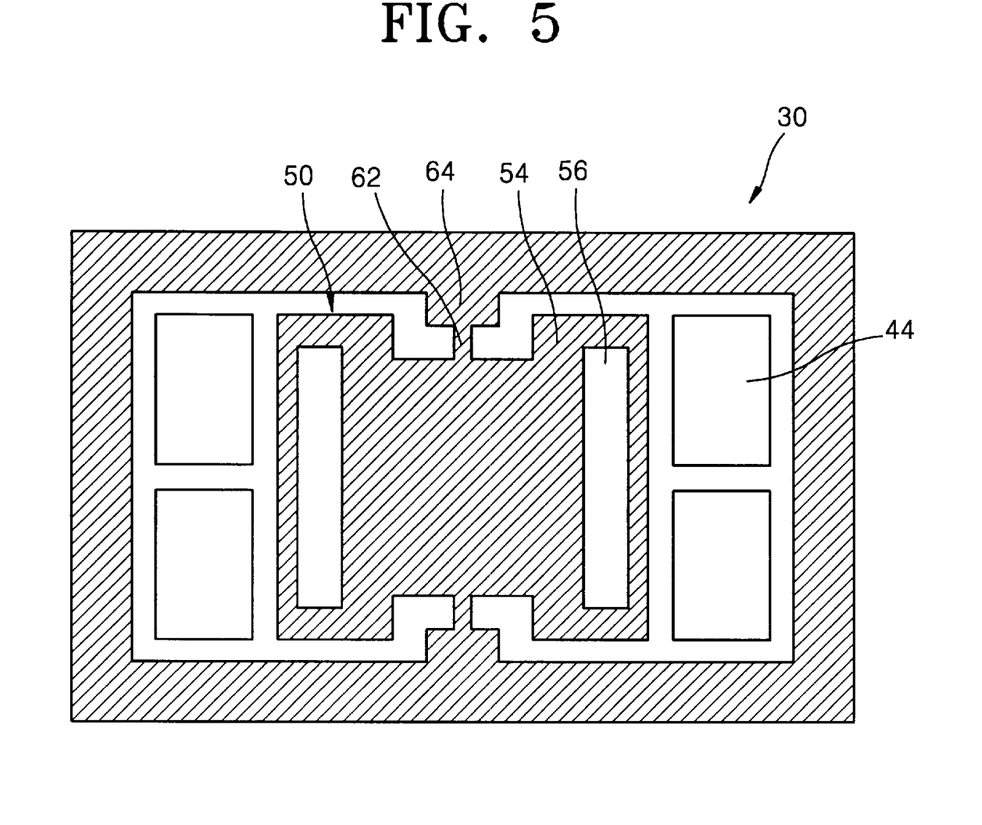
FIG. 5 is a plan view of a second wafer that corresponds to a middle layer of the structure shown in FIG. 2.

FIG. 2 is an exploded perspective view illustrating a MEMS relay according to the present invention, the top portion of which is partially removed for illustrating the MEMS relay more clearly. FIG. 3 is a cross-sectional view illustrating a MEMS relay according to the present invention. FIG. 4 is a cross-sectional view illustrating a MEMS relay according to the present invention, taken along line IV–IV' of FIG. 3. FIG. 5 is a plan view illustrating the structure of a second wafer that corresponds to a middle layer of the structure shown in FIG. 2.

Referring to FIGS. 2 through 5, a MEMS relay includes a first wafer 10, a second wafer 30, and a third wafer 70 that are sequentially stacked.

Via holes 18 are formed to vertically perforate the first wafer 10, and metal pads 20 are formed over the respective via holes 18. Ball grid arrays (BGAs) 22, which are directly connected to external circuits, are formed over the metal pads 20. Electrodes 12, 14, and 16 are formed under the via holes 18. Reference numeral 12 represents a driving electrode, and reference numerals 14 and 16 represent an input signal electrode and an output signal electrode, respectively, which are formed adjacent to each other as a pair and are short-circuited if they contact a contact electrode 56 under the input and output signal electrodes 14 and 16. As shown in FIG. 4, the input and output signal electrodes 14 and 16 form a switch with the contact electrode 56. The BGAs 22 enable the MEMS relay to be compactly packaged through flip-chip bonding.

The second wafer 30 includes a body 40 defining the edges of the second wafer 30, a driving unit 50 connected to the body 40 to be capable of being rotated, and a connection supporter 60 for connecting the driving unit 50 and the body 40. The body 40 includes a sealing unit 42, which is used to hermetically seal the first, second, and third wafers 10, 30, and 70 together, and an electrode supporter 44, which is formed inside and isolated from the sealing unit 42 and has a top surface directly contacting the input and output signal electrodes 14 and 16 to stably support the input and output signal electrodes 14 and 16. Accordingly, both of the signal electrodes 14 and 16 are insulated.

The driving unit 50 has a structure in which a silicon substrate 52, a passivation layer 54, and a contact electrode 56 are sequentially stacked and is formed floating over a space enclosed by the third wafer 70, the first wafer, and the sealing unit 42. The passivation layer 54 is formed by patterning a $SiO_2$ layer or a $Si_3N_4$ layer formed on the silicon substrate 52, and the contact electrode 56 is formed opposite to the signal electrodes 14 and 16 and acts with the signal electrodes 14 and 16 as a switch.

The connection supporter 60 includes an anchor 64, which extends from the sidewall of the body 40 toward the driving unit 50, and a torsion spring 62, which extends from the anchor 64 to connect the anchor and the driving unit 50 and support the driving unit 50.

A hollow 72 is formed in the third wafer 70 such that the driving unit 50 can rotate from side to side in the hollow 72.

Preferably, the second wafer 30 is a silicon wafer, and the first and third wafers 10 and 70 are formed of Pyrex glass (the name of a product No. 7740 manufactured by Corning Co., Ltd. in the U.S.), which have almost the same thermal expansion coefficient as the silicon wafer and thus can be anodically bonded to the silicon wafer.

Figure 6:
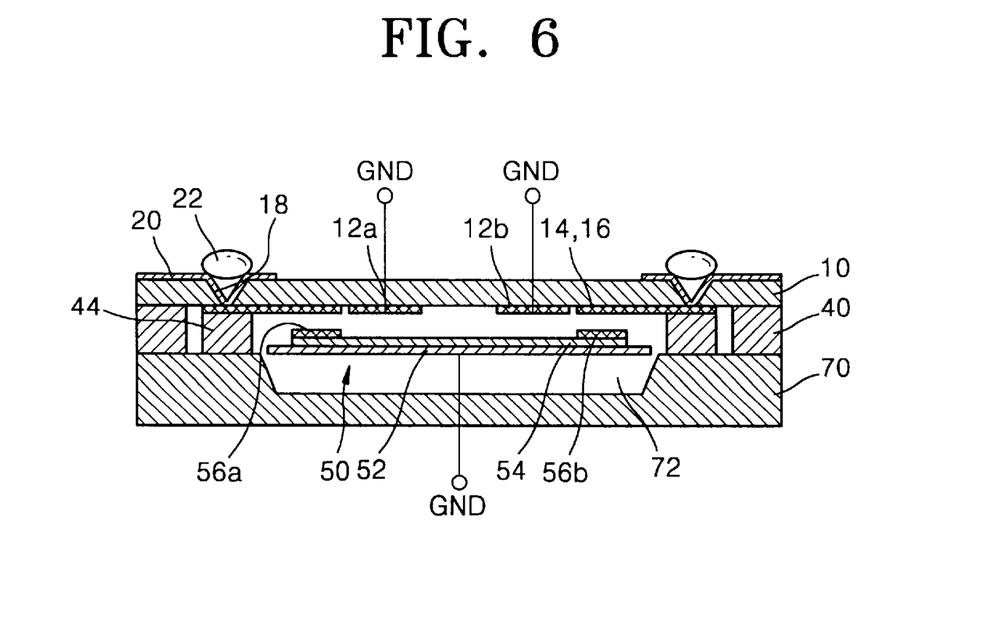
FIG. 6 is a cross-sectional view illustrating a MEMS relay according to a preferred embodiment of the present invention in a neutral state.
Figure 7:
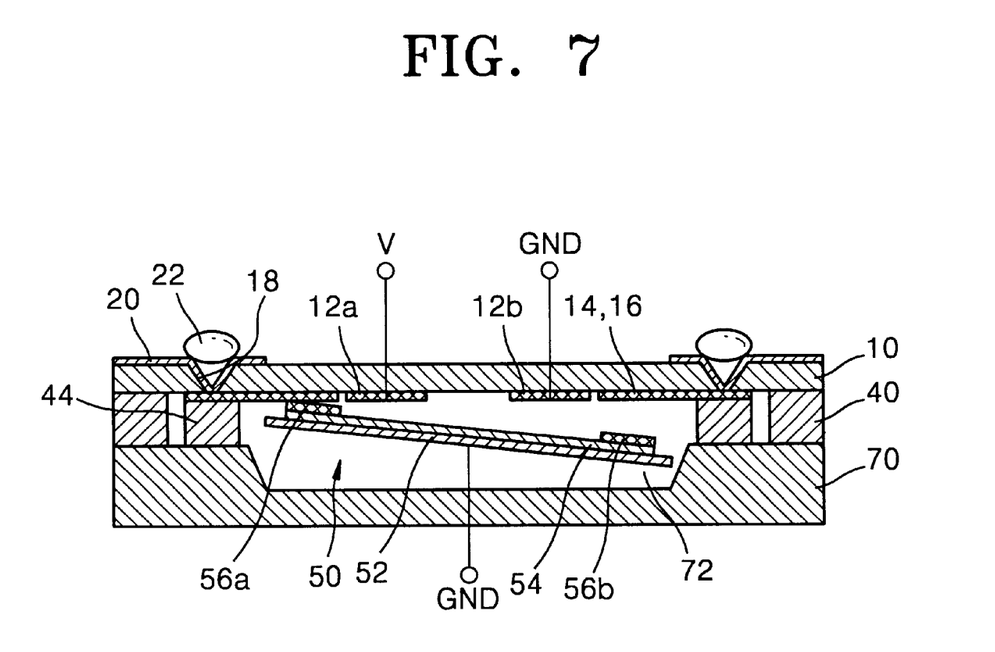

FIG. 6 is a cross-sectional view illustrating a MEMS relay in a neutral state, and FIG. 7 is a cross-sectional view illustrating a MEMS relay in a state where a left switch is turned on.

In a state where voltage is not applied to the driving electrode 12, the signal electrodes 14 and 16 are isolated from left and right contact electrodes 56a and 56b, respectively, as shown in FIG. 6. On the other hand, as shown in FIG. 7, if a voltage signal is applied to a left driving electrode 12a to generate a potential difference between the left driving electrode 12a and the driving unit 50, the left contact electrode 56a is raised due to an electrostatic force between the left contact electrode 56a and the left driving electrode 12a so that the left contact electrode 56a can contact the input and output signal electrodes 14 and 16, and accordingly, a left switch is turned on. On the contrary, if the voltage signal is changed to generate a potential difference between the right driving electrode 12b and the driving unit 50, a right contact electrode 56b is raised due to an electrostatic force between the right contact electrode 56b and the right driving electrode 12b such that the right contact electrode 56b can contact the input and output signal electrodes 14 and 16, and accordingly, a right switch is turned on.

A method for fabricating a MEMS relay having such structure will be described more fully with reference to FIGS. 8A through 8J. Referring to FIGS. 8A through 8J, a first wafer 10 formed of silicon and second and third wafers 30 and 70 formed of Pyrex glass that is an insulating material and has almost the same thermal expansion coefficient as a silicon wafer are prepared.

Figure 8A:
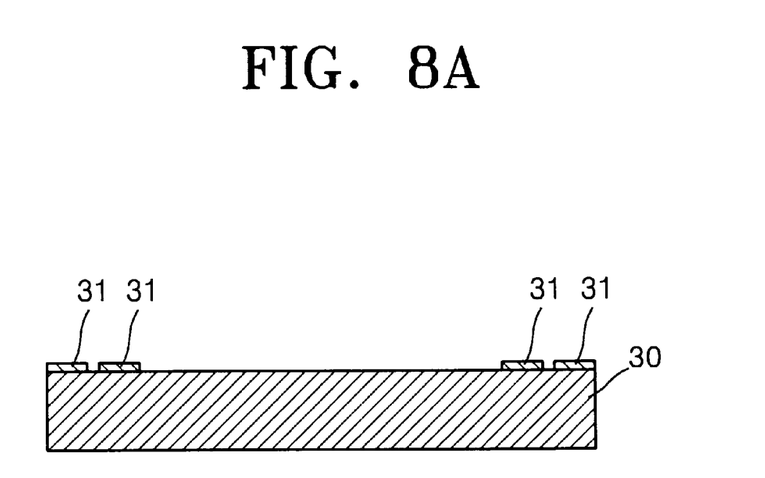
FIGS. 8A through 8J are cross-sectional views illustrating a method of fabricating a MEMS relay according to a preferred embodiment of the present invention.

Next, a mask layer 31 is formed on the second wafer 30, as shown in FIG. 8A. The material of the mask layer 31 may be photoresist, oxides, or metals according to the method for etching the second wafer 30 to be performed next.

Figure 8B:
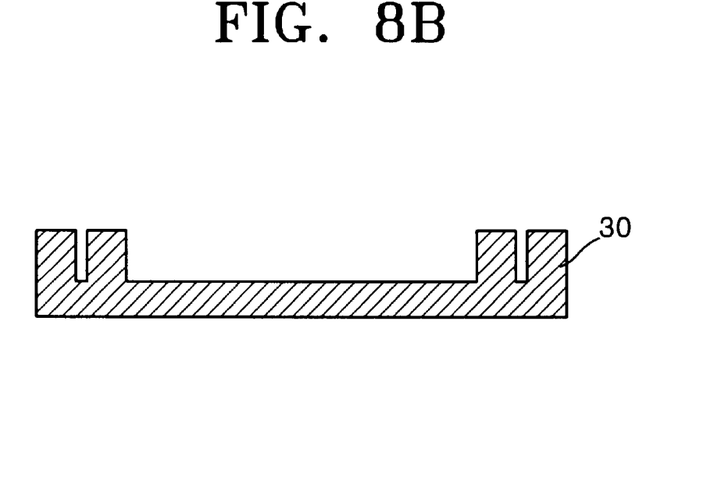

Next, the second wafer 30 is anisotropically etched to a predetermined depth, and then the mask layer 31 is removed (refer to FIG. 8B).

Figure 8C:
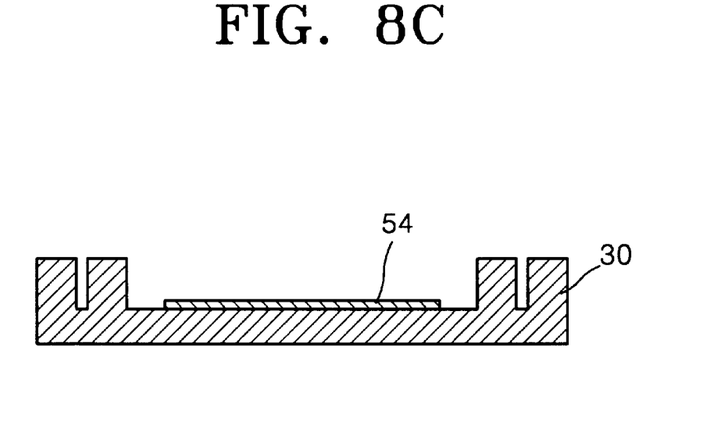

Next, a passivation layer 54 is formed of $SiO_2$ or $Si_3N_4$ on a recessed area of the second wafer 30 by patterning (refer to FIG. 8C).

Figure 8D:
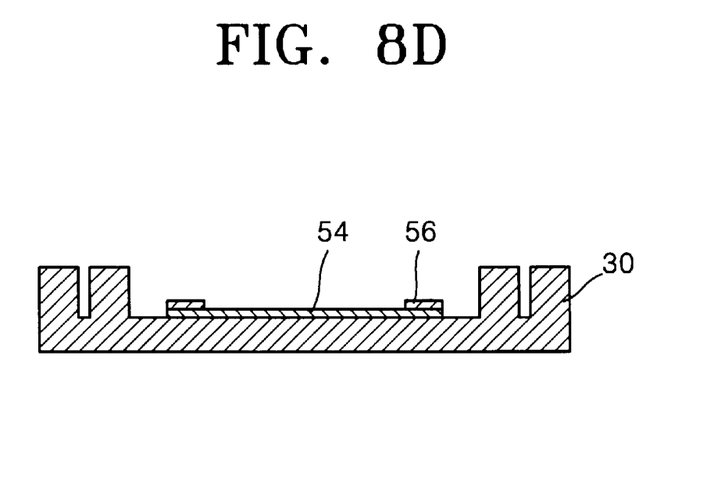

Next, a contact electrode 56 is formed on the passivation layer 54 by patterning (refer to FIG. 8D).

Figure 8E:
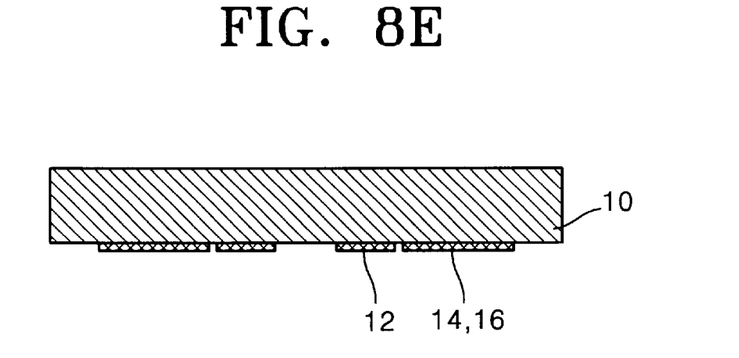

During etching the second wafer 30, electrodes 12, 14, and 16 are formed at the bottom of the first wafer 10 by patterning, as shown in FIG. 8E.

Figure 8F:
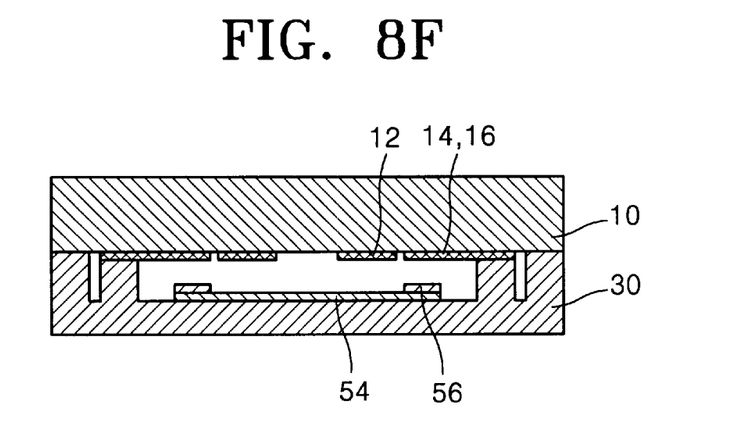
Figure 8G:
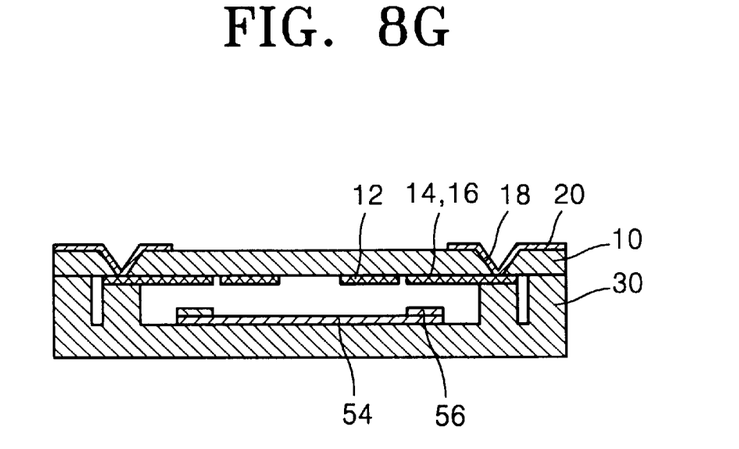

Next, as shown in FIG. 8F, the first and second wafers 10 and 30 are anodically bonded to each other, which makes it easy to control the size of a gap between the first and second wafers 10 and 30 bonded together. For example, the size of a gap between a silicon wafer and a Pyrex glass wafer can be reduced to several micro meters or below by anodic bonding.

Next, the upper portion of the first wafer 10 is planarized by chemical mechanical polishing (CMP), and via holes 18 are formed through the first wafer 10. Next, metal pads 20 are formed over the via holes 18 (refer to FIG. 8G).

Figure 8H:
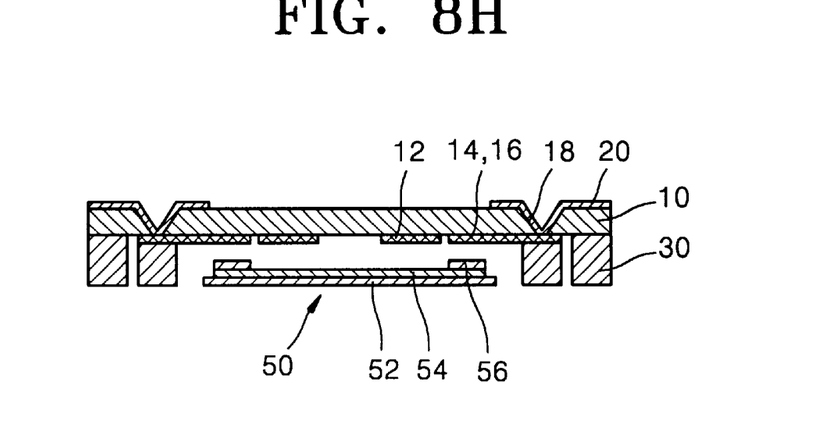

Also, the lower portion of the second wafer 30 is planarized by CMP and then is patterned and etched, thereby forming the driving unit 50 to float (refer to FIG. 8H). Actually, the driving unit 50 is supported by the connection supporter 60, as shown in FIG. 2.

Figure 8I:
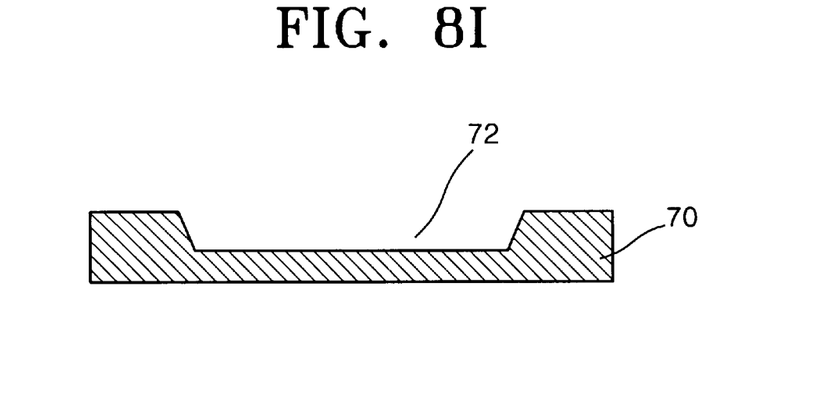

A hollow 72 is formed by etching a predetermined portion of the third wafer 70 to a predetermined depth (refer to FIG. 8I).

Figure 8J:
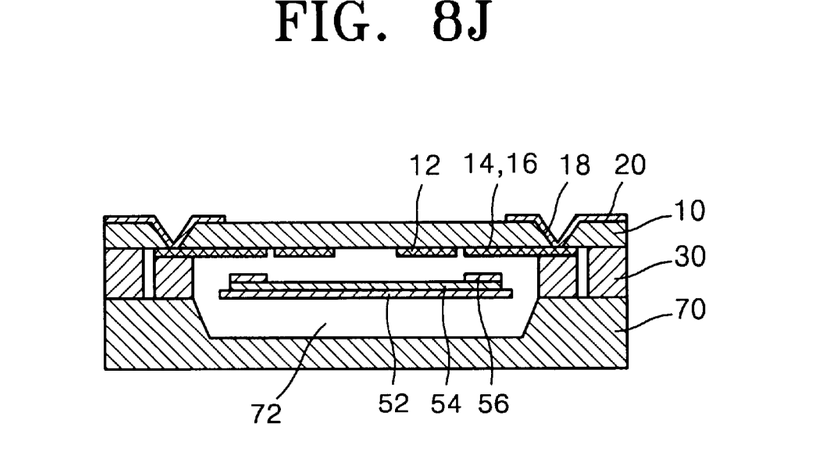

Next, the third wafer 70 is bonded to the second wafer 30, as shown in FIG. 8J.

Next, the BGAs 22 are additionally formed on the metal pads 20 to be used for flip-chip bonding in packaging the MEMS relay (refer to FIG. 3).

As described above, since the MEMS relay according to the present invention is packaged on a chip scale, there is no need to add the packaging area to the MEMS relay for wire bonding, and thus the size of the MEMS relay can be reduced. In addition, the MEMS relay has a seesaw-like structure, in which when one switch is turned on, the other is turned off. Accordingly, when one of the two switches is turned on and its electrodes are in contact, the other can be prevented from being swung, and thus the two switches can be resistant to external impacts.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A MEMS relay which comprise a first wafer, a second wafer, and a third wafer that are sequentially stacked, wherein the first wafer comprises:

driving electrodes positioned at the bottom surface of the first wafer;

input signal electrodes and output signal electrodes formed adjacent to each other and corresponding to the driving electrodes;

via holes formed through the first wafer on the driving electrodes, the input signal electrodes, and the output signal electrodes; and metal pads formed over the via holes, and the second wafer comprises:

a body including a sealing unit used to hermetically seal the first and third wafers with the second wafer interposed therebetween;

a driving unit which is formed inside and isolated from the body, is an integrated body consisting of a silicon substrate, a passivation layer formed on the silicon substrate, and contact electrodes formed on the passivation layer, and is located lower than the top surface of the body by a predetermined distance; and a connection supporter which extends from two opposing sides of the driving unit to the corresponding inner surface of the body; and the third wafer comprises a hollow in which the driving unit can be rotated.

2. The MEMS relay of claim 1, wherein the connection supporter comprises a torsion spring, which extends from the two opposing sides of the driving unit outwardly, and an anchor which connects the torsion spring to the corresponding inner surface of the body.

3. The MEMS relay of claim 1, wherein an electrode supporter is further formed on the third wafer to support each of the input and output signal electrodes.

4. The MEMS relay of claim 1, wherein the second wafer is formed of silicon, and the first and third wafers are formed of Pyrex glass.

5. The MEMS relay of claim 1, wherein the passivation layer is a $SiO_2$ layer or a $Si_3N_4$ layer.

6. The MEMS relay of claim 1, wherein ball grid arrays (BGAs) are further formed on the metal pads.

7. A method of fabricating a MEMS relay comprising:

(a) preparing a silicon wafer as a second wafer and two Pyrex glass wafers as first and third wafers;

(b) forming a mask on the second wafer and anisotropically etching the second wafer using the mask;

(c) forming a passivation layer in the middle of the second wafer and forming contact electrodes on the passivation layer by patterning;

(d) forming electrodes at the bottom of the first wafer by patterning;

(e) bonding the first and second wafers to each other;

(f) planarizing the upper portion of the first wafer by chemical mechanical polishing (CMP), forming via holes through the first wafer, and forming metal pads over the via holes;

(g) planarizing the lower portion of the second wafer by CMP, and patterning and etching the bottom portion of the second wafer;

(h) forming a hollow in the third wafer by etching a predetermined portion of the third wafer; and (i) bonding the third wafer to the lower portion of the second wafer.

8. The method of claim 7 further comprising forming BGAs on the metal pads after the step (f).

9. The method of claim 7, wherein in the step (i), the third wafer and the second wafer are anodically bonded to each other.

* * * * *